(12) United States Patent
Biberger

(10) Patent No.: US 8,877,357 B1
(45) Date of Patent: Nov. 4, 2014

(54) IMPACT RESISTANT MATERIAL

(75) Inventor: Maximilian A. Biberger, Scottsdale, AZ (US)

(73) Assignee: SDCmaterials, Inc., Tempe, AZ (US)

( * ) Notice: Subject to any disclaimer, the term of this patent is extended or adjusted under 35 U.S.C. 154(b) by 297 days.

(21) Appl. No.: 12/968,245

(22) Filed: Dec. 14, 2010

Related U.S. Application Data

(60) Provisional application No. 61/284,329, filed on Dec. 15, 2009.

(51) Int. Cl.
*B32B 15/00* (2006.01)
*B32B 15/04* (2006.01)

(52) U.S. Cl.
USPC ........... 428/698; 428/704; 428/627; 428/366; 428/427; 428/325; 156/62.2

(58) Field of Classification Search
None
See application file for complete search history.

(56) References Cited

U.S. PATENT DOCUMENTS

| | | |
|---|---|---|
| 2,284,554 A | 5/1942 | Beyerstedt |
| 2,419,042 A | 4/1947 | Todd ............................ 202/205 |
| 2,519,531 A | 8/1950 | Worn ............................... 230/95 |
| 2,562,753 A | 7/1951 | Trost ............................... 241/39 |
| 2,689,780 A | 9/1954 | Rice ............................... 23/106 |
| 3,001,402 A | 9/1961 | Koblin ......................... 73/421.5 |
| 3,042,511 A | 7/1962 | Reding, Jr. |
| 3,067,025 A | 12/1962 | Chisholm ...................... 75/84.5 |
| 3,145,287 A | 8/1964 | Siebein et al. |
| 3,178,121 A | 4/1965 | Wallace, Jr. ....................... 241/5 |
| 3,179,782 A | 4/1965 | Matvay |
| 3,181,947 A | 5/1965 | Vordahl |
| 3,313,908 A | 4/1967 | Unger et al. |
| 3,401,465 A | 9/1968 | Larwill ............................. 34/57 |
| 3,450,926 A | 6/1969 | Kiernan |
| 3,457,788 A | 7/1969 | Miyajima ....................... 73/422 |
| 3,537,513 A | 11/1970 | Austin ............................ 165/70 |
| 3,552,653 A | 1/1971 | Inoue |
| 3,617,358 A | 11/1971 | Dittrich |
| 3,667,111 A | 6/1972 | Chartet |
| 3,741,001 A | 6/1973 | Fletcher et al. .................... 73/28 |
| 3,752,172 A | 8/1973 | Cohen et al. ..................... 137/12 |

(Continued)

FOREIGN PATENT DOCUMENTS

| | | |
|---|---|---|
| EP | 1 134 302 A1 | 9/2001 |
| EP | 1 619 168 A1 | 1/2006 |

(Continued)

OTHER PUBLICATIONS

Stiles, A. B. (Jan. 1, 1987). "Manufacture of Carbon-Supported Metal Catalysts," in *Catalyst Supports and Supported Catalysts*, Butterworth Publishers, MA, pp. 125-132.

(Continued)

*Primary Examiner* — Vera Katz
(74) *Attorney, Agent, or Firm* — Morrison & Foerster LLP

(57) ABSTRACT

A method of making a composite material. The method comprises: providing a plurality of particles, wherein each one of the particles comprises a ceramic core and a metallic outer layer surrounding the core; forming a tile from the plurality of particles by performing a bonding process on the plurality of particles; and bonding the tile to a ductile backing material. In some embodiments, the ceramic core comprises boron carbide. In some embodiments, the metallic outer layer comprises at least one of copper, tantalum, titanium, molybdenum, and aluminum.

11 Claims, 3 Drawing Sheets

(56) References Cited

U.S. PATENT DOCUMENTS

| | | | |
|---|---|---|---|
| 3,761,360 A | 9/1973 | Auvil et al. | |
| 3,774,442 A | 11/1973 | Gustavsson | 73/28 |
| 3,804,034 A | 4/1974 | Stiglich, Jr. | |
| 3,830,756 A | 8/1974 | Sanchez et al. | |
| 3,871,448 A | 3/1975 | Vann et al. | |
| 3,892,882 A | 7/1975 | Guest et al. | 427/34 |
| 3,914,573 A | 10/1975 | Muehlberger | 219/76 |
| 3,959,094 A | 5/1976 | Steinberg | |
| 3,959,420 A | 5/1976 | Geddes et al. | 261/112 |
| 3,969,482 A | 7/1976 | Teller | |
| 4,008,620 A | 2/1977 | Narato et al. | 73/421.5 A |
| 4,018,388 A | 4/1977 | Andrews | 241/39 |
| 4,021,021 A | 5/1977 | Hall et al. | |
| 4,127,760 A | 11/1978 | Meyer et al. | |
| 4,139,497 A | 2/1979 | Castor et al. | 252/470 |
| 4,157,316 A | 6/1979 | Thompson et al. | |
| 4,171,288 A | 10/1979 | Keith et al. | 252/462 |
| 4,174,298 A | 11/1979 | Antos | |
| 4,189,925 A | 2/1980 | Long | |
| 4,227,928 A * | 10/1980 | Wang | 75/238 |
| 4,248,387 A | 2/1981 | Andrews | 241/5 |
| 4,253,917 A * | 3/1981 | Wang | 205/131 |
| 4,260,649 A | 4/1981 | Dension et al. | |
| 4,284,609 A | 8/1981 | deVries | 423/242 |
| 4,315,874 A | 2/1982 | Ushida et al. | |
| 4,344,779 A | 8/1982 | Isserlis | |
| 4,369,167 A | 1/1983 | Weir | |
| 4,388,274 A | 6/1983 | Rourke et al. | 422/177 |
| 4,419,331 A | 12/1983 | Montalvo | |
| 4,431,750 A | 2/1984 | McGinnis et al. | |
| 4,436,075 A | 3/1984 | Campbell et al. | 123/557 |
| 4,440,733 A | 4/1984 | Lawson et al. | |
| 4,458,138 A | 7/1984 | Adrian et al. | |
| 4,459,327 A * | 7/1984 | Wang | 427/183 |
| 4,505,945 A | 3/1985 | Dubust et al. | |
| 4,513,149 A | 4/1985 | Gray et al. | 564/449 |
| 4,523,981 A | 6/1985 | Ang et al. | |
| 4,545,872 A | 10/1985 | Sammells et al. | |
| RE32,244 E | 9/1986 | Andersen | |
| 4,609,441 A | 9/1986 | Frese, Jr. et al. | |
| 4,723,589 A | 2/1988 | Iyer et al. | |
| 4,731,517 A | 3/1988 | Cheney | |
| 4,764,283 A | 8/1988 | Ashbrook et al. | 210/695 |
| 4,765,805 A | 8/1988 | Wahl et al. | |
| 4,824,624 A | 4/1989 | Palicka et al. | 264/67 |
| 4,836,084 A | 6/1989 | Vogelesang et al. | |
| 4,855,505 A | 8/1989 | Koll | 564/398 |
| 4,866,240 A | 9/1989 | Webber | 219/121.47 |
| 4,885,038 A | 12/1989 | Anderson et al. | |
| 4,921,586 A | 5/1990 | Molter | |
| 4,983,555 A | 1/1991 | Roy et al. | 501/120 |
| 4,987,033 A | 1/1991 | Abkowitz et al. | 428/469 |
| 5,006,163 A | 4/1991 | Benn et al. | |
| 5,015,863 A * | 5/1991 | Takeshima et al. | 250/515.1 |
| 5,041,713 A | 8/1991 | Weidman | |
| 5,043,548 A | 8/1991 | Whitney et al. | 219/121.84 |
| 5,070,064 A | 12/1991 | Hsu et al. | |
| 5,073,193 A | 12/1991 | Chaklader et al. | 75/346 |
| 5,133,190 A | 7/1992 | Abdelmalek | |
| 5,151,296 A | 9/1992 | Tokunaga | |
| 5,157,007 A | 10/1992 | Domesle et al. | |
| 5,192,130 A | 3/1993 | Endo et al. | |
| 5,230,844 A | 7/1993 | Macaire et al. | |
| 5,233,153 A | 8/1993 | Coats | |
| 5,269,848 A | 12/1993 | Nakagawa | |
| 5,330,945 A | 7/1994 | Beckmeyer et al. | |
| 5,338,716 A | 8/1994 | Triplett et al. | |
| 5,369,241 A | 11/1994 | Taylor et al. | 219/121.47 |
| 5,371,049 A | 12/1994 | Moffett et al. | 501/89 |
| 5,372,629 A | 12/1994 | Anderson et al. | 75/332 |
| 5,392,797 A | 2/1995 | Welch | 134/108 |
| 5,436,080 A * | 7/1995 | Inoue et al. | 428/546 |
| 5,439,865 A | 8/1995 | Abe et al. | 502/333 |
| 5,442,153 A | 8/1995 | Marantz et al. | 219/121.47 |
| 5,460,701 A | 10/1995 | Parker et al. | |
| 5,464,458 A | 11/1995 | Yamamoto | |
| 5,485,941 A | 1/1996 | Guyomard et al. | 222/1 |
| 5,534,149 A | 7/1996 | Birkenbeil et al. | 210/636 |
| 5,534,270 A | 7/1996 | De Castro | |
| 5,543,173 A | 8/1996 | Horn, Jr. et al. | |
| 5,553,507 A | 9/1996 | Basch et al. | 73/863.01 |
| 5,562,966 A | 10/1996 | Clarke et al. | |
| 5,582,807 A | 12/1996 | Liao et al. | |
| 5,611,896 A | 3/1997 | Swanepoel et al. | 204/169 |
| 5,630,322 A | 5/1997 | Heilmann et al. | 62/95 |
| 5,652,304 A | 7/1997 | Calderon et al. | |
| 5,714,644 A | 2/1998 | Irgang et al. | |
| 5,723,187 A | 3/1998 | Popoola et al. | |
| 5,726,414 A | 3/1998 | Kitahashi et al. | |
| 5,749,938 A | 5/1998 | Coombs | 75/332 |
| 5,776,359 A | 7/1998 | Schultz et al. | 252/62.51 |
| 5,788,738 A | 8/1998 | Pirzada et al. | 75/331 |
| 5,804,155 A | 9/1998 | Farrauto et al. | |
| 5,811,187 A | 9/1998 | Anderson et al. | 428/403 |
| 5,837,959 A | 11/1998 | Muehlberger et al. | 219/121.47 |
| 5,851,507 A | 12/1998 | Pirzada et al. | 423/659 |
| 5,853,815 A | 12/1998 | Muehlberger | 427/446 |
| 5,858,470 A | 1/1999 | Bernecki et al. | |
| 5,884,473 A | 3/1999 | Noda et al. | |
| 5,905,000 A | 5/1999 | Yadav et al. | 429/33 |
| 5,928,806 A | 7/1999 | Olah et al. | |
| 5,935,293 A | 8/1999 | Detering et al. | 75/10.29 |
| 5,973,289 A | 10/1999 | Read et al. | |
| 5,989,648 A | 11/1999 | Phillips | 427/456 |
| 5,993,967 A | 11/1999 | Brotzman, Jr. et al. | 428/407 |
| 5,993,988 A | 11/1999 | Ohara et al. | 429/40 |
| 6,004,620 A | 12/1999 | Camm | |
| 6,012,647 A | 1/2000 | Ruta et al. | 239/132.1 |
| 6,033,781 A | 3/2000 | Brotzman, Jr. et al. | 428/405 |
| 6,045,765 A | 4/2000 | Nakatsuji et al. | |
| 6,059,853 A | 5/2000 | Coombs | 75/332 |
| 6,066,587 A | 5/2000 | Kurokawa et al. | |
| 6,084,197 A | 7/2000 | Fusaro, Jr. | |
| 6,093,306 A | 7/2000 | Hanrahan et al. | |
| 6,093,378 A | 7/2000 | Deeba et al. | |
| 6,102,106 A | 8/2000 | Manning et al. | 165/76 |
| 6,117,376 A | 9/2000 | Merkel | |
| 6,168,694 B1 | 1/2001 | Huang et al. | |
| 6,190,627 B1 | 2/2001 | Hoke et al. | |
| 6,213,049 B1 | 4/2001 | Yang | 118/723 |
| 6,214,195 B1 | 4/2001 | Yadav et al. | 205/334 |
| 6,228,904 B1 | 5/2001 | Yadav et al. | 523/210 |
| 6,254,940 B1 | 7/2001 | Pratsinis et al. | 427/562 |
| 6,261,484 B1 | 7/2001 | Phillips et al. | 264/5 |
| 6,267,864 B1 | 7/2001 | Yadav et al. | 205/341 |
| 6,322,756 B1 | 11/2001 | Arno et al. | |
| 6,342,465 B1 | 1/2002 | Klein et al. | |
| 6,344,271 B1 | 2/2002 | Yadav et al. | 428/402 |
| 6,362,449 B1 | 3/2002 | Hadidi et al. | |
| 6,379,419 B1 | 4/2002 | Celik et al. | 75/346 |
| 6,387,560 B1 | 5/2002 | Yadav et al. | 429/45 |
| 6,395,214 B1 | 5/2002 | Kear et al. | 264/434 |
| 6,398,843 B1 | 6/2002 | Tarrant | 75/249 |
| 6,409,851 B1 | 6/2002 | Sethuram et al. | 148/565 |
| 6,413,781 B1 | 7/2002 | Geis et al. | 436/178 |
| 6,416,818 B1 | 7/2002 | Aikens et al. | 427/383.1 |
| RE37,853 E | 9/2002 | Detering et al. | 75/10.19 |
| 6,444,009 B1 | 9/2002 | Liu et al. | 75/332 |
| 6,475,951 B1 | 11/2002 | Domesle et al. | |
| 6,488,904 B1 | 12/2002 | Cox et al. | |
| 6,506,995 B1 | 1/2003 | Fusaro, Jr. et al. | |
| 6,517,800 B1 | 2/2003 | Cheng et al. | 423/447.1 |
| 6,524,662 B2 | 2/2003 | Jang et al. | 427/535 |
| 6,531,704 B2 | 3/2003 | Yadav et al. | 250/493.1 |
| 6,548,445 B1 | 4/2003 | Buysch et al. | |
| 6,554,609 B2 | 4/2003 | Yadav et al. | 432/9 |
| 6,562,304 B1 | 5/2003 | Mizrahi | |
| 6,562,495 B2 | 5/2003 | Yadav et al. | 429/12 |
| 6,569,393 B1 | 5/2003 | Hoke et al. | |
| 6,569,397 B1 | 5/2003 | Yadav et al. | 423/345 |
| 6,569,518 B2 | 5/2003 | Yadav et al. | 428/323 |
| 6,572,672 B2 | 6/2003 | Yadav et al. | 75/343 |
| 6,579,446 B1 | 6/2003 | Teran et al. | |
| 6,596,187 B2 | 7/2003 | Coll et al. | 216/56 |

(56) References Cited

U.S. PATENT DOCUMENTS

| | | | |
|---|---|---|---|
| 6,603,038 B1 | 8/2003 | Hagemeyer et al. | 560/241.1 |
| 6,607,821 B2 | 8/2003 | Yadav et al. | 428/323 |
| 6,610,355 B2 | 8/2003 | Yadav et al. | 427/115 |
| 6,623,559 B2 | 9/2003 | Huang | 117/87 |
| 6,635,357 B2 | 10/2003 | Moxson et al. | 428/548 |
| 6,641,775 B2 | 11/2003 | Vigliotti et al. | 264/618 |
| 6,652,822 B2 | 11/2003 | Phillips et al. | 423/290 |
| 6,652,967 B2 | 11/2003 | Yadav et al. | 428/403 |
| 6,669,823 B1 | 12/2003 | Sarkas et al. | 204/164 |
| 6,682,002 B2 | 1/2004 | Kyotani | 239/318 |
| 6,689,192 B1 | 2/2004 | Phillips et al. | 75/342 |
| 6,699,398 B1 | 3/2004 | Kim | 216/55 |
| 6,706,097 B2 | 3/2004 | Zornes | 96/153 |
| 6,706,660 B2 | 3/2004 | Park | |
| 6,710,207 B2 | 3/2004 | Bogan, Jr. et al. | |
| 6,713,176 B2 | 3/2004 | Yadav et al. | 428/402 |
| 6,716,525 B1 | 4/2004 | Yadav et al. | 428/402 |
| 6,744,006 B2 | 6/2004 | Johnson et al. | |
| 6,746,791 B2 | 6/2004 | Yadav et al. | 429/30 |
| 6,772,584 B2 | 8/2004 | Chun et al. | 60/275 |
| 6,786,950 B2 | 9/2004 | Yadav et al. | 75/346 |
| 6,813,931 B2 | 11/2004 | Yadav et al. | 73/31.05 |
| 6,817,388 B2 | 11/2004 | Tsangaris et al. | 141/82 |
| 6,832,735 B2 | 12/2004 | Yadav et al. | 241/16 |
| 6,838,072 B1 | 1/2005 | Kong et al. | 423/594.2 |
| 6,841,509 B1 | 1/2005 | Hwang et al. | |
| 6,855,410 B2 * | 2/2005 | Buckley | 428/311.11 |
| 6,855,426 B2 | 2/2005 | Yadav | 428/403 |
| 6,855,749 B1 | 2/2005 | Yadav et al. | 523/105 |
| 6,858,170 B2 | 2/2005 | Van Thillo et al. | |
| 6,886,545 B1 | 5/2005 | Holm | 123/568.21 |
| 6,896,958 B1 | 5/2005 | Cayton et al. | 428/323 |
| 6,902,699 B2 | 6/2005 | Fritzemeier et al. | 419/38 |
| 6,916,872 B2 | 7/2005 | Yadav et al. | 524/430 |
| 6,919,065 B2 | 7/2005 | Zhou et al. | |
| 6,919,527 B2 | 7/2005 | Boulos et al. | 219/121.52 |
| 6,933,331 B2 | 8/2005 | Yadav et al. | 523/210 |
| 6,972,115 B1 | 12/2005 | Ballard | |
| 6,986,877 B2 | 1/2006 | Takikawa et al. | 423/447.3 |
| 6,994,837 B2 | 2/2006 | Boulos et al. | 423/613 |
| 7,007,872 B2 | 3/2006 | Yadav et al. | 241/1 |
| 7,022,305 B2 | 4/2006 | Drumm et al. | |
| 7,052,777 B2 | 5/2006 | Brotzman, Jr. et al. | 428/570 |
| 7,073,559 B2 | 7/2006 | O'Larey et al. | 164/76.1 |
| 7,081,267 B2 | 7/2006 | Yadav | 427/115 |
| 7,101,819 B2 | 9/2006 | Rosenflanz et al. | 501/10 |
| 7,147,544 B2 | 12/2006 | Rosenflanz | 451/28 |
| 7,147,894 B2 | 12/2006 | Zhou et al. | 427/256 |
| 7,166,198 B2 | 1/2007 | Van Der Walt et al. | 204/165 |
| 7,166,663 B2 | 1/2007 | Cayton et al. | 524/430 |
| 7,172,649 B2 | 2/2007 | Conrad et al. | 106/35 |
| 7,172,790 B2 | 2/2007 | Koulik et al. | |
| 7,178,747 B2 | 2/2007 | Yadav et al. | 241/23 |
| 7,208,126 B2 | 4/2007 | Musick et al. | 423/69 |
| 7,211,236 B2 | 5/2007 | Stark et al. | 423/592.1 |
| 7,217,407 B2 | 5/2007 | Zhang | 423/610 |
| 7,220,398 B2 | 5/2007 | Sutorik et al. | 423/593.1 |
| 7,255,498 B2 | 8/2007 | Bush et al. | |
| 7,265,076 B2 | 9/2007 | Taguchi et al. | |
| 7,307,195 B2 | 12/2007 | Polverejan et al. | 585/443 |
| 7,323,655 B2 | 1/2008 | Kim | 219/121.43 |
| 7,384,447 B2 | 6/2008 | Kodas et al. | 75/332 |
| 7,402,899 B1 | 7/2008 | Whiting et al. | |
| 7,417,008 B2 | 8/2008 | Richards et al. | |
| 7,494,527 B2 | 2/2009 | Jurewicz et al. | 75/346 |
| 7,517,826 B2 | 4/2009 | Fujdala et al. | |
| 7,534,738 B2 | 5/2009 | Fujdala et al. | |
| 7,541,012 B2 | 6/2009 | Yeung et al. | |
| 7,541,310 B2 | 6/2009 | Espinoza et al. | |
| 7,557,324 B2 | 7/2009 | Nylen et al. | |
| 7,572,315 B2 | 8/2009 | Boulos et al. | 75/336 |
| 7,576,029 B2 | 8/2009 | Saito et al. | |
| 7,576,031 B2 | 8/2009 | Beutel et al. | |
| 7,604,843 B1 | 10/2009 | Robinson et al. | |
| 7,611,686 B2 | 11/2009 | Alekseeva et al. | 423/276 |
| 7,615,097 B2 | 11/2009 | McKechnie et al. | 75/346 |
| 7,618,919 B2 | 11/2009 | Shimazu et al. | |
| 7,622,693 B2 | 11/2009 | Foret | 219/121.43 |
| 7,632,775 B2 | 12/2009 | Zhou et al. | |
| 7,635,218 B1 | 12/2009 | Lott | |
| 7,674,744 B2 | 3/2010 | Shiratori et al. | |
| 7,678,419 B2 | 3/2010 | Kevwitch et al. | |
| 7,704,369 B2 | 4/2010 | Olah et al. | |
| 7,709,411 B2 | 5/2010 | Zhou et al. | |
| 7,709,414 B2 | 5/2010 | Fujdala et al. | |
| 7,745,367 B2 | 6/2010 | Fujdala et al. | |
| 7,750,265 B2 | 7/2010 | Belashchenko | |
| 7,803,210 B2 | 9/2010 | Sekine et al. | 75/334 |
| 7,851,405 B2 | 12/2010 | Wakamatsu et al. | |
| 7,874,239 B2 * | 1/2011 | Howland | 89/36.05 |
| 7,875,573 B2 | 1/2011 | Beutel et al. | |
| 7,897,127 B2 | 3/2011 | Layman et al. | |
| 7,902,104 B2 | 3/2011 | Kalck | |
| 7,905,942 B1 | 3/2011 | Layman | |
| 7,935,655 B2 | 5/2011 | Tolmachev | |
| 8,051,724 B1 | 11/2011 | Layman et al. | |
| 8,076,258 B1 | 12/2011 | Biberger | |
| 8,080,494 B2 | 12/2011 | Yasuda et al. | |
| 8,089,495 B2 | 1/2012 | Keller | |
| 8,142,619 B2 | 3/2012 | Layman et al. | |
| 8,168,561 B2 | 5/2012 | Virkar | |
| 8,173,572 B2 | 5/2012 | Feaviour | |
| 8,211,392 B2 | 7/2012 | Grubert et al. | |
| 8,258,070 B2 | 9/2012 | Fujdala et al. | |
| 8,278,240 B2 | 10/2012 | Tange et al. | |
| 8,294,060 B2 | 10/2012 | Mohanty et al. | |
| 8,309,489 B2 | 11/2012 | Roldan Cuenya et al. | |
| 8,349,761 B2 | 1/2013 | Xia et al. | |
| 8,557,727 B2 | 10/2013 | Yin et al. | |
| 2001/0004009 A1 | 6/2001 | MacKelvie | |
| 2001/0042802 A1 | 11/2001 | Youds | 241/5 |
| 2001/0055554 A1 | 12/2001 | Hoke et al. | |
| 2002/0018815 A1 | 2/2002 | Sievers et al. | 424/489 |
| 2002/0068026 A1 | 6/2002 | Murrell et al. | 422/211 |
| 2002/0071800 A1 | 6/2002 | Hoke et al. | |
| 2002/0079620 A1 | 6/2002 | DuBuis et al. | 264/328.14 |
| 2002/0100751 A1 | 8/2002 | Carr | 219/209 |
| 2002/0102674 A1 | 8/2002 | Anderson | 435/174 |
| 2002/0131914 A1 | 9/2002 | Sung | |
| 2002/0143417 A1 | 10/2002 | Ito et al. | |
| 2002/0182735 A1 | 12/2002 | Kibby et al. | |
| 2002/0183191 A1 | 12/2002 | Faber et al. | |
| 2002/0192129 A1 | 12/2002 | Shamouilian et al. | |
| 2003/0036786 A1 | 2/2003 | Duren et al. | 607/96 |
| 2003/0042232 A1 | 3/2003 | Shimazu | 219/121.47 |
| 2003/0047617 A1 | 3/2003 | Shanmugham et al. | |
| 2003/0066800 A1 | 4/2003 | Saim et al. | 264/5 |
| 2003/0108459 A1 | 6/2003 | Wu et al. | 422/186.04 |
| 2003/0110931 A1 | 6/2003 | Aghajanian et al. | |
| 2003/0129098 A1 | 7/2003 | Endo et al. | |
| 2003/0139288 A1 | 7/2003 | Cai et al. | |
| 2003/0143153 A1 | 7/2003 | Boulos et al. | |
| 2003/0172772 A1 | 9/2003 | Sethuram et al. | 501/87 |
| 2003/0223546 A1 | 12/2003 | McGregor et al. | 378/143 |
| 2004/0009118 A1 | 1/2004 | Phillips et al. | 423/592.1 |
| 2004/0023302 A1 | 2/2004 | Archibald et al. | 435/7.1 |
| 2004/0023453 A1 | 2/2004 | Xu et al. | 257/369 |
| 2004/0077494 A1 | 4/2004 | LaBarge et al. | 502/303 |
| 2004/0103751 A1 | 6/2004 | Joseph et al. | 75/10.19 |
| 2004/0109523 A1 | 6/2004 | Singh et al. | |
| 2004/0119064 A1 | 6/2004 | Narayan et al. | |
| 2004/0127586 A1 | 7/2004 | Jin et al. | |
| 2004/0166036 A1 | 8/2004 | Chen et al. | |
| 2004/0167009 A1 | 8/2004 | Kuntz et al. | 501/95.2 |
| 2004/0176246 A1 | 9/2004 | Shirk et al. | 502/439 |
| 2004/0208805 A1 | 10/2004 | Fincke et al. | |
| 2004/0213998 A1 | 10/2004 | Hearley et al. | 428/402 |
| 2004/0238345 A1 | 12/2004 | Koulik et al. | |
| 2004/0251017 A1 | 12/2004 | Pillion et al. | 165/289 |
| 2004/0251241 A1 | 12/2004 | Blutke et al. | |
| 2005/0000321 A1 | 1/2005 | O'Larey et al. | 75/952 |
| 2005/0000950 A1 | 1/2005 | Schroder et al. | 219/121.59 |
| 2005/0066805 A1 | 3/2005 | Park et al. | |
| 2005/0070431 A1 | 3/2005 | Alvin et al. | |

(56) References Cited

U.S. PATENT DOCUMENTS

| | | | |
|---|---|---|---|
| 2005/0077034 A1 | 4/2005 | King | 165/163 |
| 2005/0097988 A1 | 5/2005 | Kodas et al. | 75/332 |
| 2005/0106865 A1 | 5/2005 | Chung et al. | |
| 2005/0133121 A1 | 6/2005 | Subramanian et al. | |
| 2005/0163673 A1 | 7/2005 | Johnson et al. | |
| 2005/0199739 A1 | 9/2005 | Kuroda et al. | 239/13 |
| 2005/0220695 A1 | 10/2005 | Abatzoglou et al. | 423/445 |
| 2005/0227864 A1 | 10/2005 | Sutorik et al. | |
| 2005/0233380 A1 | 10/2005 | Pesiri et al. | 435/7.1 |
| 2005/0240069 A1 | 10/2005 | Polverejan et al. | 585/444 |
| 2005/0258766 A1 | 11/2005 | Kim | 315/111.21 |
| 2005/0275143 A1* | 12/2005 | Toth | 264/646 |
| 2006/0051505 A1 | 3/2006 | Kortshagen et al. | 427/212 |
| 2006/0068989 A1 | 3/2006 | Ninomiya et al. | 502/339 |
| 2006/0094595 A1 | 5/2006 | Labarge | |
| 2006/0096393 A1 | 5/2006 | Pesiri | |
| 2006/0105910 A1 | 5/2006 | Zhou et al. | 502/338 |
| 2006/0108332 A1 | 5/2006 | Belashchenko | 219/121.47 |
| 2006/0153728 A1 | 7/2006 | Schoenung et al. | 419/32 |
| 2006/0153765 A1 | 7/2006 | Pham-Huu et al. | 423/345 |
| 2006/0159596 A1 | 7/2006 | De La Veaux et al. | 422/151 |
| 2006/0166809 A1 | 7/2006 | Malek et al. | |
| 2006/0211569 A1 | 9/2006 | Dang et al. | |
| 2006/0213326 A1 | 9/2006 | Gollob et al. | |
| 2006/0222780 A1 | 10/2006 | Gurevich et al. | |
| 2006/0231525 A1 | 10/2006 | Asakawa et al. | 216/56 |
| 2007/0048206 A1 | 3/2007 | Hung et al. | 423/335 |
| 2007/0049484 A1 | 3/2007 | Kear et al. | |
| 2007/0063364 A1 | 3/2007 | Hsiao et al. | 264/5 |
| 2007/0084308 A1 | 4/2007 | Nakamura et al. | 75/346 |
| 2007/0084834 A1 | 4/2007 | Hanus et al. | 219/121.5 |
| 2007/0087934 A1 | 4/2007 | Martens et al. | 502/214 |
| 2007/0163385 A1 | 7/2007 | Takahashi et al. | |
| 2007/0173403 A1 | 7/2007 | Koike et al. | 502/300 |
| 2007/0178673 A1 | 8/2007 | Gole et al. | |
| 2007/0221404 A1 | 9/2007 | Das et al. | |
| 2007/0253874 A1 | 11/2007 | Foret | 422/186.07 |
| 2007/0292321 A1 | 12/2007 | Plischke et al. | 422/198 |
| 2008/0006954 A1 | 1/2008 | Yubuta et al. | |
| 2008/0026041 A1 | 1/2008 | Tepper et al. | |
| 2008/0031806 A1 | 2/2008 | Gavenonis et al. | |
| 2008/0038578 A1 | 2/2008 | Li | |
| 2008/0045405 A1 | 2/2008 | Beutel et al. | |
| 2008/0047261 A1 | 2/2008 | Han et al. | |
| 2008/0057212 A1 | 3/2008 | Dorier et al. | |
| 2008/0064769 A1 | 3/2008 | Sato et al. | |
| 2008/0105083 A1 | 5/2008 | Nakamura et al. | 75/255 |
| 2008/0116178 A1 | 5/2008 | Weidman | 219/121.47 |
| 2008/0125308 A1 | 5/2008 | Fujdala et al. | |
| 2008/0125313 A1 | 5/2008 | Fujdala et al. | |
| 2008/0138651 A1 | 6/2008 | Doi et al. | |
| 2008/0175936 A1 | 7/2008 | Tokita et al. | |
| 2008/0187714 A1 | 8/2008 | Wakamatsu et al. | |
| 2008/0206562 A1 | 8/2008 | Stucky et al. | |
| 2008/0207858 A1 | 8/2008 | Kowaleski et al. | |
| 2008/0248704 A1 | 10/2008 | Mathis et al. | |
| 2008/0274344 A1 | 11/2008 | Vieth et al. | |
| 2008/0277092 A1 | 11/2008 | Layman et al. | |
| 2008/0277264 A1 | 11/2008 | Sprague | |
| 2008/0277266 A1 | 11/2008 | Layman | |
| 2008/0277267 A1 | 11/2008 | Biberger et al. | |
| 2008/0277268 A1 | 11/2008 | Layman | |
| 2008/0277269 A1 | 11/2008 | Layman et al. | |
| 2008/0277270 A1 | 11/2008 | Biberger et al. | |
| 2008/0277271 A1 | 11/2008 | Layman | |
| 2008/0280049 A1 | 11/2008 | Kevwitch et al. | |
| 2008/0280751 A1 | 11/2008 | Harutyunyan et al. | |
| 2008/0280756 A1 | 11/2008 | Biberger | |
| 2008/0283411 A1 | 11/2008 | Eastman et al. | |
| 2008/0283498 A1 | 11/2008 | Yamazaki | |
| 2009/0010801 A1 | 1/2009 | Murphy et al. | |
| 2009/0054230 A1 | 2/2009 | Veeraraghavan et al. | |
| 2009/0088585 A1 | 4/2009 | Schammel et al. | |
| 2009/0092887 A1 | 4/2009 | McGrath et al. | |
| 2009/0098402 A1 | 4/2009 | Kang et al. | |
| 2009/0114568 A1 | 5/2009 | Trevino et al. | |
| 2009/0162991 A1 | 6/2009 | Beneyton et al. | |
| 2009/0168506 A1 | 7/2009 | Han et al. | |
| 2009/0170242 A1 | 7/2009 | Lin et al. | |
| 2009/0181474 A1 | 7/2009 | Nagai | |
| 2009/0200180 A1 | 8/2009 | Capote et al. | |
| 2009/0208367 A1 | 8/2009 | Calio et al. | |
| 2009/0209408 A1 | 8/2009 | Kitamura et al. | |
| 2009/0223410 A1 | 9/2009 | Jun et al. | |
| 2009/0253037 A1 | 10/2009 | Park et al. | |
| 2009/0274897 A1 | 11/2009 | Kaner et al. | |
| 2009/0274903 A1 | 11/2009 | Addiego | |
| 2009/0286899 A1 | 11/2009 | Hofmann et al. | |
| 2009/0324468 A1 | 12/2009 | Golden et al. | |
| 2010/0089002 A1 | 4/2010 | Merkel | |
| 2010/0092358 A1 | 4/2010 | Koegel et al. | |
| 2010/0124514 A1 | 5/2010 | Chelluri et al. | |
| 2010/0166629 A1 | 7/2010 | Deeba | |
| 2010/0180581 A1 | 7/2010 | Grubert et al. | |
| 2010/0180582 A1 | 7/2010 | Mueller-Stach et al. | |
| 2010/0186375 A1 | 7/2010 | Kazi et al. | |
| 2010/0240525 A1 | 9/2010 | Golden et al. | |
| 2010/0275781 A1 | 11/2010 | Tsangaris | |
| 2011/0006463 A1 | 1/2011 | Layman | |
| 2011/0052467 A1 | 3/2011 | Chase et al. | |
| 2011/0143041 A1 | 6/2011 | Layman et al. | |
| 2011/0143915 A1 | 6/2011 | Yin et al. | |
| 2011/0143916 A1 | 6/2011 | Leamon | |
| 2011/0143930 A1 | 6/2011 | Yin et al. | |
| 2011/0143933 A1 | 6/2011 | Yin et al. | |
| 2011/0144382 A1 | 6/2011 | Yin et al. | |
| 2011/0152550 A1 | 6/2011 | Grey et al. | |
| 2011/0158871 A1 | 6/2011 | Arnold et al. | |
| 2011/0174604 A1 | 7/2011 | Duesel et al. | |
| 2011/0243808 A1 | 10/2011 | Fossey et al. | |
| 2011/0245073 A1 | 10/2011 | Oljaca et al. | |
| 2011/0247336 A9 | 10/2011 | Farsad et al. | |
| 2011/0305612 A1 | 12/2011 | Möller-Stach et al. | |
| 2012/0023109 A1 | 2/2012 | Lambert et al. | |
| 2012/0045373 A1 | 2/2012 | Biberger | |
| 2012/0097033 A1 | 4/2012 | Arnold et al. | |
| 2012/0122660 A1 | 5/2012 | Andersen et al. | |
| 2012/0124974 A1 | 5/2012 | Li et al. | |
| 2012/0171098 A1 | 7/2012 | Hung et al. | |
| 2012/0308467 A1 | 12/2012 | Carpenter et al. | |
| 2013/0213018 A1 | 8/2013 | Yin et al. | |

FOREIGN PATENT DOCUMENTS

| | | |
|---|---|---|
| GB | 1 307 941 A | 2/1973 |
| JP | 56-146804 A | 11/1981 |
| JP | 61-086815 A | 5/1986 |
| JP | 62-102827 A | 5/1987 |
| JP | 63-214342 A | 9/1988 |
| JP | 1-164795 A | 6/1989 |
| JP | 05-228361 A | 9/1993 |
| JP | 05-324094 A | 12/1993 |
| JP | 6-93309 A | 4/1994 |
| JP | 6-135797 A | 5/1994 |
| JP | 6-272012 A | 9/1994 |
| JP | H6-065772 | 9/1994 |
| JP | 7031873 A | 2/1995 |
| JP | 07-256116 | 10/1995 |
| JP | 8-158033 A | 6/1996 |
| JP | 10-130810 A | 5/1998 |
| JP | 11-502760 A | 3/1999 |
| JP | 2000-220978 A | 8/2000 |
| JP | 2002-88486 A | 3/2002 |
| JP | 2002-336688 A | 11/2002 |
| JP | 2004-233007 A | 8/2004 |
| JP | 2004-249206 A | 9/2004 |
| JP | 2004-290730 A | 10/2004 |
| JP | 2005-503250 A | 2/2005 |
| JP | 2005-122621 A | 5/2005 |
| JP | 2005-218937 A | 8/2005 |
| JP | 2005-342615 A | 12/2005 |
| JP | 2006-001779 A | 1/2006 |
| JP | 2006-508885 A | 3/2006 |
| JP | 2006-247446 A | 9/2006 |

(56) References Cited

FOREIGN PATENT DOCUMENTS

| | | | | |
|---|---|---|---|---|
| JP | 2006-260385 A | 9/2006 | | |
| JP | 2007-46162 A | 2/2007 | | |
| JP | 2007-203129 A | 8/2007 | | |
| SU | 493241 | 3/1976 | | |
| TW | 200611449 | 4/2006 | | |
| TW | 201023207 A | 6/2010 | | |
| WO | WO-96/28577 A1 | 9/1996 | | |
| WO | WO 02/092503 A1 | 11/2002 | ............ | C01B 21/064 |
| WO | WO 2004/052778 A2 | 6/2004 | ............ | C01B 13/28 |
| WO | WO-2005/063390 A1 | 7/2005 | | |
| WO | WO 2006/079213 A1 | 8/2006 | ................ | B01J 2/04 |
| WO | WO-2008-130451 A2 | 10/2008 | | |
| WO | WO-2008/130451 A3 | 10/2008 | | |
| WO | WO-2011/081833 A1 | 7/2011 | | |

OTHER PUBLICATIONS

Bateman, J. E. et al. (Dec. 17, 1998). "Alkylation of Porous Silicon by Direct Reaction with Alkenes and Alkynes," *Angew. Chem Int. Ed.* 37(19):2683-2685.

Carrot, G. et al. (Sep. 17, 2002). "Surface-Initiated Ring-Opening Polymerization: A Versatile Method for Nanoparticle Ordering," *Macromolecules* 35(22):8400-8404.

Chen, H.-S. et al. (Jul. 3, 2001). "On the Photoluminescence of Si Nanoparticles," *Mater. Phys. Mech.* 4:62-66.

Fojtik, A. et al. (Apr. 29, 1994). "Luminescent Colloidal Silicon Particles," *Chemical Physics Letters* 221:363-367.

Fojtik, A. (Jan. 13, 2006). "Surface Chemistry of Luminescent Colloidal Silicon Nanoparticles," *J. Phys. Chem. B.* 110(5):1994-1998.

Hua, F. et al. (Mar. 2006). "Organically Capped Silicon Nanoparticles With Blue Photoluminescence Prepared by Hydrosilylation Followed by Oxidation," *Langmuir* 22(9):4363-4370.

Jouet, R. J. et al. (Jan. 25, 2005). "Surface Passivation of Bare Aluminum Nanoparticles Using Perfluoroalkyl Carboxylic Acids," *Chem. Mater.* 17(11):2987-2996.

Kim, N. Y. et al. (Mar. 5, 1997). "Thermal Derivatization of Porous Silicon with Alcohols," *J. Am. Chem. Soc.* 119(9):2297-2298.

Kwon, Y.-S. et al. (Apr. 30, 2003). "Passivation Process for Superfine Aluminum Powders Obtained by Electrical Explosion of Wires," *Applied Surface Science* 211:57-67.

Langner, A. et al. (Aug. 25, 2005). "Controlled Silicon Surface Functionalization by Alkene Hydrosilylation," *J. Am. Chem. Soc.* 127(37):12798-12799.

Li, D. et al. (Apr. 9, 2005). "Environmentally Responsive "Hairy" Nanoparticles: Mixed Homopolymer Brushes on Silica Nanoparticles Synthesized by Living Radical Polymerization Techniques," *J. Am. Chem. Soc.* 127(7):6248-6256.

Li, X. et al. (May 25, 2004). "Surface Functionalization of Silicon Nanoparticles Produced by Laser-Driven Pyrolysis of Silane Followed by HF-HNO$_3$ Etching," *Langmuir* 20(11):4720-4727.

Liao, Y.-C. et al. (Jun. 27, 2006). "Self-Assembly of Organic Monolayers on Aerosolized Silicon Nanoparticles," *J.Am. Chem. Soc.* 128(28):9061-9065.

Liu, S.-M. et al. (Jan. 13, 2006). "Enhanced Photoluminescence from Si Nano-Organosols by Functionalization With Alkenes and Their Size Evolution," *Chem. Mater.* 18(3):637-642.

Neiner, D. (Aug. 5, 2006). "Low-Temperature Solution Route to Macroscopic Amounts of Hydrogen Terminated Silicon Nanoparticles," *J. Am. Chem. Soc.* 128(34):11016-11017.

Netzer, L. et al. (1983). "A New Approach to Construction of Artificial Monolayer Assemblies," *J. Am. Chem. Soc.* 105(3):674-676.

Sailor, M. J. (1997). "Surface Chemistry of Luminescent Silicon Nanocrystallites," *Adv. Mater.* 9(10):783-793.

Tao, Y.-T. (May 1993). "Structural Comparison of Self-Assembled Monolayers of *n*-Alkanoic Acids on the surfaces of Silver, Copper, and Aluminum," *J. Am. Chem. Soc.* 115(10):4350-4358.

Zou, J. et al. (Jun. 4, 2004). "Solution Synthesis of Ultrastable Luminescent Siloxane-Coated Silicon Nanoparticles," *Nano Letters* 4(7):1181-1186.

U.S. Appl. No. 12/001,602, filed Dec. 11, 2007, for Biberger et al.
U.S. Appl. No. 12/001,643, filed Dec. 11, 2007, for Biberger et al.
U.S. Appl. No. 12/001,644, filed Dec. 11, 2007, for Biberger et al.
U.S. Appl. No. 12/151,830, filed May 8, 2008, for Biberger et al.
U.S. Appl. No. 12/152,084, filed May 9, 2008, for Biberger.
U.S. Appl. No. 12/152,111, filed May 9, 2008, for Biberger et al.
U.S. Appl. No. 12/474,081, filed May 28, 2009, for Biberger et al.
U.S. Appl. No. 12/943,909, filed Nov. 10, 2010, for Layman.
U.S. Appl. No. 12/954,813, filed Nov. 26, 2010, for Biberger.
U.S. Appl. No. 12/954,822, filed Nov. 26, 2010, for Biberger.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/962,463, filed Dec. 7, 2010, for Leamon.
U.S. Appl. No. 12/962,523, filed Dec. 7, 2010, for Yin et al.
U.S. Appl. No. 12/962,533, filed Dec. 7, 2010, for Yin et al.
U.S. Appl. No. 12/968,235, filed Dec. 14, 2010, for Biberger.
U.S. Appl. No. 12/968,239, filed Dec. 14, 2010, for Biberger.
U.S. Appl. No. 12/968,241, filed Dec. 14, 2010, for Biberger.
U.S. Appl. No. 12/968,248, filed Dec. 14, 2010, for Biberger.
U.S. Appl. No. 12/968,253, filed Dec. 14, 2010, for Biberger.
U.S. Appl. No. 12/969,087, filed Dec. 15, 2010, for Biberger.
U.S. Appl. No. 12/969,128, filed Dec. 15, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/969,457, filed Nov. 15, 2010, for Leamon et al.
U.S. Appl. No. 12/969,503, filed Nov. 15, 2010, for Leamon et al.
U.S. Appl. No. 13/028,693, filed Feb. 16, 2011, for Biberger.
U.S. Appl. No. 13/033,514, filed Feb. 23, 2011, for Biberger et al.
U.S. Appl. No. 13/291,983, filed Nov. 8, 2011, for Layman et al.

A. Gutsch et al., "Gas-Phase Production of Nanoparticles", Kona No. 20, 2002, pp. 24-37.

Dr. Heike Mühlenweg et al., "Gas-Phase Reactions—Open Up New Roads to Nanoproducts", Degussa ScienceNewsletter No. 08, 2004, pp. 12-16.

Coating Generation: Vaporization of Particles in Plasma Spraying and Splat Formation, M. Vardelle, A. Vardelle, K-I li, P. Fauchais, Universite de Limoges, 123 Avenue A. Thomas 87000, Limoges, F. , Pure & Chem, vol. 68, No. 5, pp. 1093-1099, 1996.

H. Konrad et al. "Nanostructured Cu-Bi Alloys Prepared by Co-Evaporation in a Continuous Gas Flow," NanoStructured Materials, vol. 7, No. 6, 1996, pp. 605-610.

Kenvin et al. "Supported Catalysts Prepared from Mononuclear Copper Complexes: Catalytic Properties", Journal of Catalysis, pp. 81-91,(1992).

J. Heberlein, "New Approaches in Thermal Plasma Technology", Pure Appl. Chem., vol. 74, No. 3, 2002, pp. 327-335.

M. Vardelle et al., "Experimental Investigation of Powder Vaporization in Thermal Plasma Jets," Plasma Processing, vol. 11, No. 2, Jun. 1991, pp. 185-201.

National Aeromautics and Space Administration, "Enthalpy", http://www.grc.nasa.gov/WWW/K-12/airplane/enthalpy.html, Nov. 23, 2009, 1 page.

P. Fauchais et al., "Plasma Spray: Study of the Coating Generation," Ceramics International, Elsevier, Amsterdam, NL, vol. 22, No. 4, Jan. 1996, pp. 295-303.

P. Fauchais et al., "Les Dépôts Par Plasma Thermique," Revue Generale De L'Electricitie, RGE. Paris, FR, No. 2, Jan. 1993, pp. 7-12.

P. Fauchais et al, "La Projection Par Plasma: Une Revue," Annales De Physique, vol. 14, No. 3, Jun. 1989, pp. 261-310.

T. Yoshida, "The Future of Thermal Plasma Processing for Coating", Pure & Appl. Chem., vol. 66, No. 6, 1994 pp. 1223-1230.

Han et al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670&DOC=FILE.PDF., 6 pages.

Nagai, Yasutaka, et al., "Sintering Inhibition Mechanism of Platinum Supported on Ceria-based Oxide and Pt-oxide-support Interaction,"Journal of Catalysis 242 (2006), pp. 103-109, Jul. 3, 2006, Elsevier.

Derwent English Abstract for publication No. SU 193241 A, Application No. 1973SU1943286 filed on Jul. 2, 1973, published on Mar.

(56) References Cited

OTHER PUBLICATIONS 1, 1976, entitled Catalyst for Ammonia Synthesis Contains Oxides of Aluminium, Potassium, Calcium, Iron and Nickel Oxide for Increased Activity, 3 pgs.

Ji, Y. et al. (Nov. 2002) "Processing and Mechanical Properties of $Al_2O_3$-5 vol.% Cr Nanocomposites," *Journal of the European Ceramic Society* 22(12):1927-1936.

"Platinum Group Metals: Annual Review 1996" (Oct. 1997). Engineering and Mining Journal, p. 63.

Rahaman, R. A. et al. (1995). "Synthesis of Powders," in *Ceramic Processing and Sintering*, Marcel Decker, Inc., New York, pp. 71-77.

Subramanian, S. et al. (1991). "Structure and Activity of Composite Oxide Supported Platinum-Iridium Catalysts," *Applied Catalysts* 74: 65-81.

Ünal, N. et al. (Nov. 2011). "Influence of WC Particles on the Microstructural and Mechanical Properties of 3 mol% $Y_2O_3$ Stabilized $ZrO_2$ Matrix Composites Produced by Hot Pressing," Journal of the European Ceramic Society (31)13: 2267-2275.

Non Final Office Action mailed on Oct. 17, 2012, for U.S. Appl. No. 12/968,248, filed Dec. 14, 2010, 18 pages.

Non Final Office Action mailed on Sep. 26, 2012, for U.S. Appl. No. 12/968,241, filed Dec. 14, 2010, for Biberger et al.

Non-Final Office Action mailed Nov. 8, 2012, for U.S. Appl. No. 12/968,253, filed Dec. 14, 2010, for Biberger et al., 13 pages.

Non Final Office Action mailed Dec. 14, 2012, for U.S. Appl. No. 12/962,508, filed Dec. 7, 2010, for Yin et al.; 11 pages.

Babin, A. et al. (1985). "Solvents Used in the Arts," Center for Safety in the Arts: 16 pages.

Chen, W.-J. et al. (Mar. 18, 2008). "Functional $Fe_3O_4/TiO_2$ Core/Shell Magnetic Nanoparticles as Photokilling Agents for Pathogenic Bacteria," *Small* 4(4): 485-491.

Faber, K. T. et al. (Sep. 1988). "Toughening by Stress-Induced Microcracking in Two-Phase Ceramics," *Journal of the American Ceramic* Society 71: C-399-C401.

Gangeri, M. et al. (2009). "Fe and Pt Carbon Nanotubes for the Electrocatalytic Conversion of Carbon Dioxide to Oxygenates," *Catalysis Today* 143: 57-63.

Luo, J. et al. (2008). "Core/Shell Nanoparticles as Electrocatalysts for Fuel Cell Reactions," *Advanced Materials* 20: 4342-4347.

Mignard, D. et al. (2003). "Methanol Synthesis from Flue-Gas $CO_2$ and Renewable Electricity: A Feasibility Study," *International Journal of Hydrogen Energy* 28: 455-464.

Park, H.-Y. et al. (May 30, 2007). "Fabrication of Magnetic Core@Shell Fe Oxide@Au Nanoparticles for Interfacial Bioactivity and Bio-Separation," *Langmuir* 23: 9050-9056.

Park, N.-G. et al. (Feb. 17, 2004). "Morphological and Photoelectrochemical Characterization of Core-Shell Nanoparticle Films for Dye-Sensitized Solar Cells: Zn-O Type Shell on $SnO_2$ and $TiO_2$ Cores," *Langmuir* 20: 4246-4253.

"Plasma Spray and Wire Flame Spray Product Group," located at http://www.processmaterials.com/spray.html, published by Process Materials, Inc., last accessed Aug. 5, 2013, 2 pages.

U.S. Appl. No. 13/589,024, filed Aug. 17, 2012, for Yin et al.

U.S. Appl. No. 13/801,726, filed Mar. 13, 2013, for Qi et al.

Chaim, R. et al. (2009). "Densification of Nanocrystalline $Y_2O_3$ Ceramic Powder by Spark Plasma Sintering," *Journal of European Ceramic Society* 29: 91-98.

Viswanathan, V. et al. (2006). "Challenges and Advances in Nanocomposite Processing Techniques," *Materials Science and Engineering* R 54: 121-285.

Non-Final Office Action mailed Mar. 7, 2014, for U.S. Appl. No. 12/968,253, filed Dec. 14, 2010, for Biberger, 15 pages.

\* cited by examiner

IMPACT RESISTANT MATERIAL

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention relates to the field of composite materials. More specifically, the present invention relates to the formation of composite materials using a novel ceramic-metallic tile.

BACKGROUND OF THE INVENTION

While composite materials have a variety of different applications, all of which are within the scope of the present invention, they may be particularly useful in the production of body armor, such as bullet-proof vests.

Currently, body armor is formed by bonding two types of armor together. A meltable plate is bonded to a hard plate via melting in an autoclave. However, the resulting armor is limited in both its hardness and its ductility.

What is needed in the art is a way to improve the hardness and the ductility of body armor and other composite materials.

SUMMARY OF THE INVENTION

While the present invention is particularly useful in forming body armor, it is contemplated that it may have a variety of other applications as well, all of which are within the scope of the present invention.

In one aspect of the present invention, a method of making a tile is provided. The method comprises providing a plurality of particles, wherein each one of the particles comprises a ceramic core and a metallic outer layer surrounding the core, and forming a tile from the plurality of particles by performing a bonding process on the plurality of particles.

In some embodiments, the ceramic core comprises boron carbide. In some embodiments, the metallic outer layer comprises at least one of copper, tantalum, titanium, molybdenum, and aluminum.

In some embodiments, the step of providing the plurality of particles comprises forming a plasma within a plasma production chamber and vaporizing a metallic material with the plasma, thereby forming a coater-plasma mixture comprising the vaporized metallic material. A mixture stream comprising the coater-plasma mixture flows through a coating chamber towards an outlet of the coating chamber, wherein the mixture stream reaches a maximum enthalpy at a location within the coating chamber, then decreases in enthalpy as it proceeds toward the outlet. A ceramic coatee powder is delivered into the mixture stream at a location between the location of maximum enthalpy and the chamber outlet, wherein the enthalpy of the mixture stream at the location of delivery is less than the maximum enthalpy and the ceramic coatee powder becomes entrained in the mixture stream. The vaporized metallic material is at least partially condensed onto the ceramic coatee powder, thereby coating individual particles of the ceramic coatee powder with the metallic material to form the plurality of particles entrained within the mixture stream.

In some embodiments, the bonding process is a sintering process. In some embodiments, the sintering process is a spark plasma sintering process.

In another aspect of the present invention, a method of making a composite material is provided. The method comprises providing a plurality of particles, wherein each one of the particles comprises a ceramic core and a metallic outer layer surrounding the core, and forming a tile from the plurality of particles by performing a bonding process on the plurality of particles. The tile is then bonded to a ductile backing material.

In some embodiments, the ceramic core comprises boron carbide. In some embodiments, the metallic outer layer comprises at least one of copper, tantalum, titanium, molybdenum, and aluminum.

In some embodiments, the step of providing the plurality of particles comprises forming a plasma within a plasma production chamber and vaporizing a metallic material with the plasma, thereby forming a coater-plasma mixture comprising the vaporized metallic material. A mixture stream comprising the coater-plasma mixture flows through a coating chamber towards an outlet of the coating chamber, wherein the mixture stream reaches a maximum enthalpy at a location within the coating chamber, then decreases in enthalpy as it proceeds toward the outlet. A ceramic coatee powder is delivered into the mixture stream at a location between the location of maximum enthalpy and the chamber outlet, wherein the enthalpy of the mixture stream at the location of delivery is less than the maximum enthalpy and the ceramic coatee powder becomes entrained in the mixture stream. The vaporized metallic material is at least partially condensed onto the ceramic coatee powder, thereby coating individual particles of the ceramic coatee powder with the metallic material to form the plurality of particles entrained within the mixture stream.

In some embodiments, the bonding process is a sintering process. In some embodiments, the sintering process is a spark plasma sintering process.

In some embodiments, the ductile backing material comprises a plurality of fibers. In some embodiments, the ductile backing material comprises a plurality of polyethylene fibers.

In some embodiments, the tile is bonded to the ductile backing material using an autoclave process. In some embodiments, the tile is bonded to the ductile backing material using heat-curable adhering material and catalyzed foamable exothermic material between the tile and the ductile backing material, wherein heat generated from the use of the catalyzed foamable exothermic material cures the heat-curable adhering material. In some embodiments, the adhering material is resin.

In yet another aspect of the present invention, a tile is provided comprising a plurality of particles bonded together, wherein each one of the particles comprises a ceramic core and a metallic outer layer surrounding the core.

In some embodiments, the ceramic core comprises boron carbide. In some embodiments, the metallic outer layer comprises at least one of copper, tantalum, titanium, molybdenum, and aluminum.

In yet another aspect of the present invention, a composite material is provided comprising a tile comprising a plurality of particles bonded together, wherein each one of the particles comprises a ceramic core and a metallic outer layer surrounding the core, and a ductile backing material bonded to the tile.

In some embodiments, the ceramic core comprises boron carbide. In some embodiments, the metallic outer layer comprises at least one of copper, tantalum, titanium, molybdenum, and aluminum.

In some embodiments, the ductile backing material comprises a plurality of fibers. In some embodiments, the ductile backing material comprises a plurality of polyethylene fibers.

In some embodiments, the composite material further comprises an adhering material disposed between the tile and the ductile backing material, wherein the adhering material bonds the tile and the ductile backing material together. In some embodiments, the composite material further comprises a cured adhering material and a foam material disposed between the tile and the ductile backing material, wherein the cured adhering material and the foam material bond the tile and the ductile backing material together.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

This disclosure refers to both particles and powders. These two terms are equivalent, except for the caveat that a singular "powder" refers to a collection of particles. The present invention may apply to a wide variety of powders and particles. Powders that fall within the scope of the present invention may include, but are not limited to, any of the following: (a) nano-structured powders (nano-powders), having an average grain size less than 250 nanometers and an aspect ratio between one and one million; (b) submicron powders, having an average grain size less than 1 micron and an aspect ratio between one and one million; (c) ultra-fine powders, having an average grain size less than 100 microns and an aspect ratio between one and one million; and (d) fine powders, having an average grain size less than 500 microns and an aspect ratio between one and one million.

Figure 1:
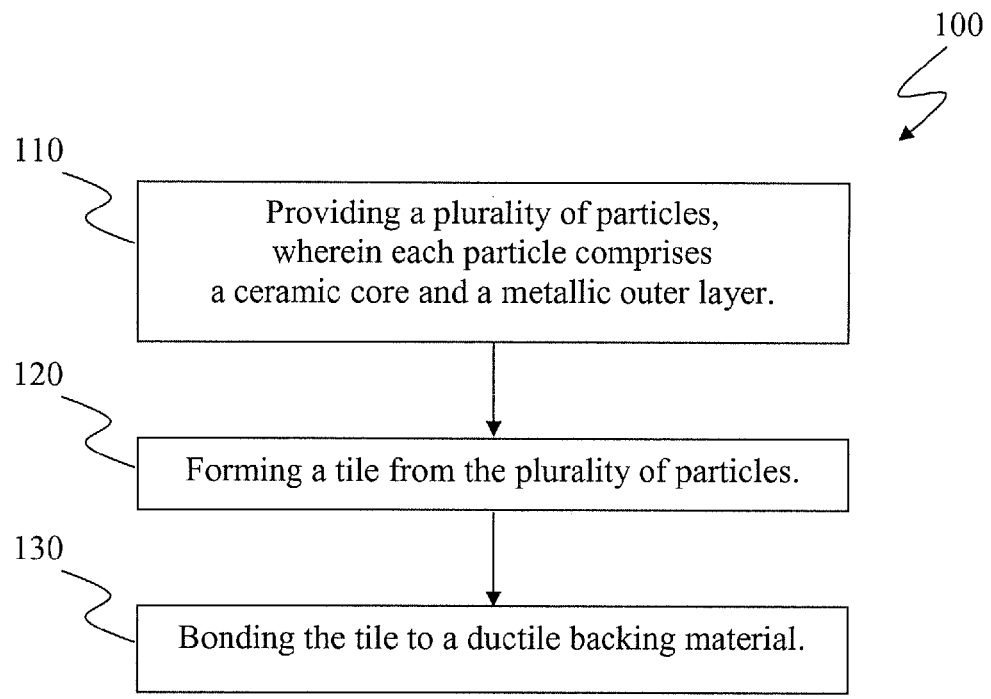
FIG. 1 is a flowchart illustrating one embodiment of a method of making a composite material in accordance with the principles of the present invention.

FIG. 1 is a flowchart illustrating one embodiment of a method 100 of making a composite material in accordance with the principles of the present invention. As mentioned above, in some embodiments, the method of the present invention is used in forming body armor. However, it is contemplated that it has a variety of other applications as well, all of which are within the scope of the present invention.

Figure 2:
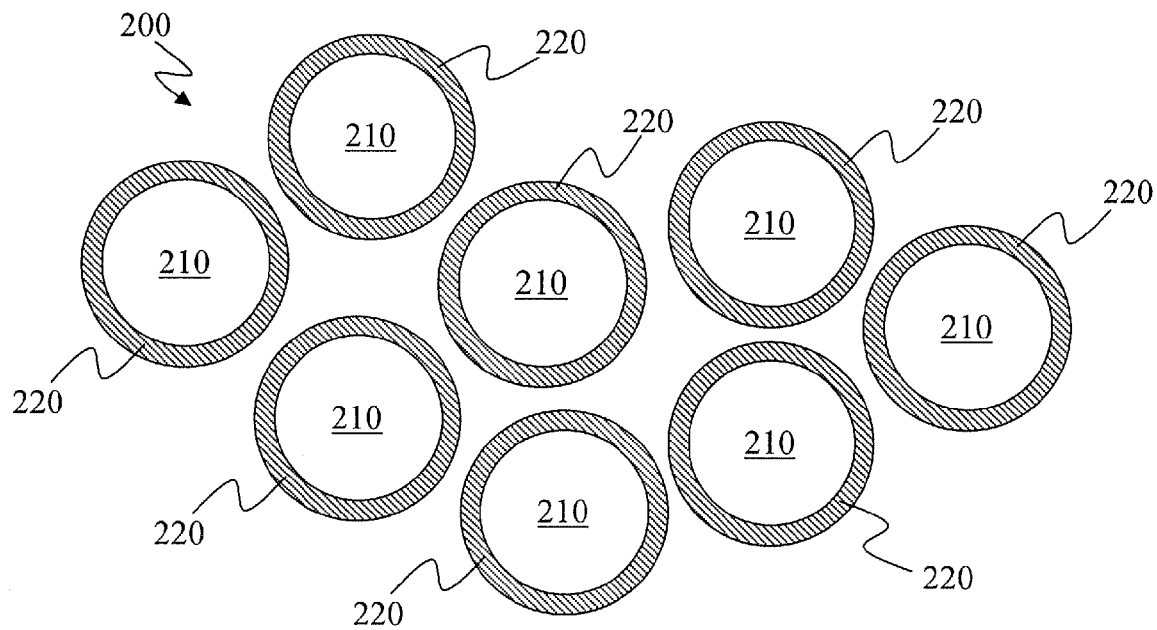
FIG. 2 illustrates one embodiment of a plurality of particles having a ceramic core and a metallic outer layer in accordance with the principles of the present invention.

At step 110, a plurality of particles are provided. Each particle comprises a ceramic core and a metallic outer layer. FIG. 2 illustrates one embodiment of a plurality of particles 200, with each particle having a ceramic core 210 and a metallic outer layer 220. While FIG. 2 shows the particles being uniformly sized and shaped, it is contemplated that the particles can also vary in size and shape. In some embodiments, the ceramic cores 210 in the plurality of particles are each micron-sized, having an average grain size greater than or equal to 1 micron. In some embodiments, the thickness of the metallic outer layer 220 is substantially uniform around the entire ceramic core 210, while in other embodiments, the thickness of the metallic outer layer 220 is not uniform around the entire ceramic core 210.

In some embodiments, the ceramic core 210 comprises boron carbide. However, it is contemplated that other ceramic materials can be used in addition to or as an alternative to boron carbide. In some embodiments, the ceramic core 210 consists of only one ceramic material. For example, in some embodiments, the ceramic core 210 consists only of boron carbide. In other embodiments, the ceramic core 210 comprises a combination of ceramic materials. It is contemplated that any metallic material can be used for the metallic outer layer 220. However, certain metals have been found to be particularly advantageous. Such metals include copper, tantalum, titanium, molybdenum, and aluminum. In some embodiments, the metallic outer layer 220 consists of only one type of metal. For example, in some embodiments, the metallic outer layer 220 consists only of copper. In other embodiments, the metallic outer layer 220 comprises a combination of different metals.

It is contemplated that the plurality of particles having a ceramic core and a metallic outer layer can be produced and provided in a variety of different ways, using a variety of different systems. The present invention considers a wide variety of gas phase particle production systems including combustion based systems, plasma based systems, laser ablation systems and vapor deposition systems. The preferred systems take material inputs in a broad range of forms, including solid phase inputs, and provide product in high surface area forms, including powders ranging in grain size from nano-structured to fine. In addition, the process controls preferably provide a fine degree over a plurality of reaction parameters, permitting fine gradients of product composition ratios to be produced.

An exemplary particle production system that can be used for the present invention is a plasma powder production reactor. Generally, the plasma powder production reactor produces an output comprising particles entrained within a gas stream. Particle production preferably includes the steps of combination, reaction, and conditioning. The present invention can employ concepts similar to those used in the nano-powder production systems disclosed in related U.S. patent application Ser. No. 11/110,341, filed on Apr. 19, 2005 and entitled, "HIGH THROUGHPUT DISCOVERY OF MATERIALS THROUGH VAPOR PHASE SYNTHESIS", which is currently published as U.S. Publication No. 2005-0233380-A. In such nano-powder production systems, working gas is supplied from a gas source to a plasma reactor. Within the plasma reactor, energy is delivered to the working gas, thereby creating a plasma. A variety of different means can be employed to deliver this energy, including, but not limited to, DC coupling, capacitive coupling, inductive coupling, and resonant coupling. One or more material dispensing devices introduce at least one material, preferably in powder form, into the plasma reactor. The combination within the plasma reactor of the plasma and the material(s) introduced by the material dispensing device(s) forms a highly reactive and energetic mixture, wherein the powder can be vaporized. This mixture of vaporized powder moves through the plasma reactor in the flow direction of the working gas. As it moves, the mixture cools and particles are formed therein. The still-energetic output mixture, comprising hot gas and energetic particles, is emitted from the plasma reactor.

A wide variety of material types and forms can be processed in preferable particle production reactors used in the present invention. Without prejudice, the present invention specifically considers the provision of materials in the following forms: solid, liquid and gas.

Figure 3:
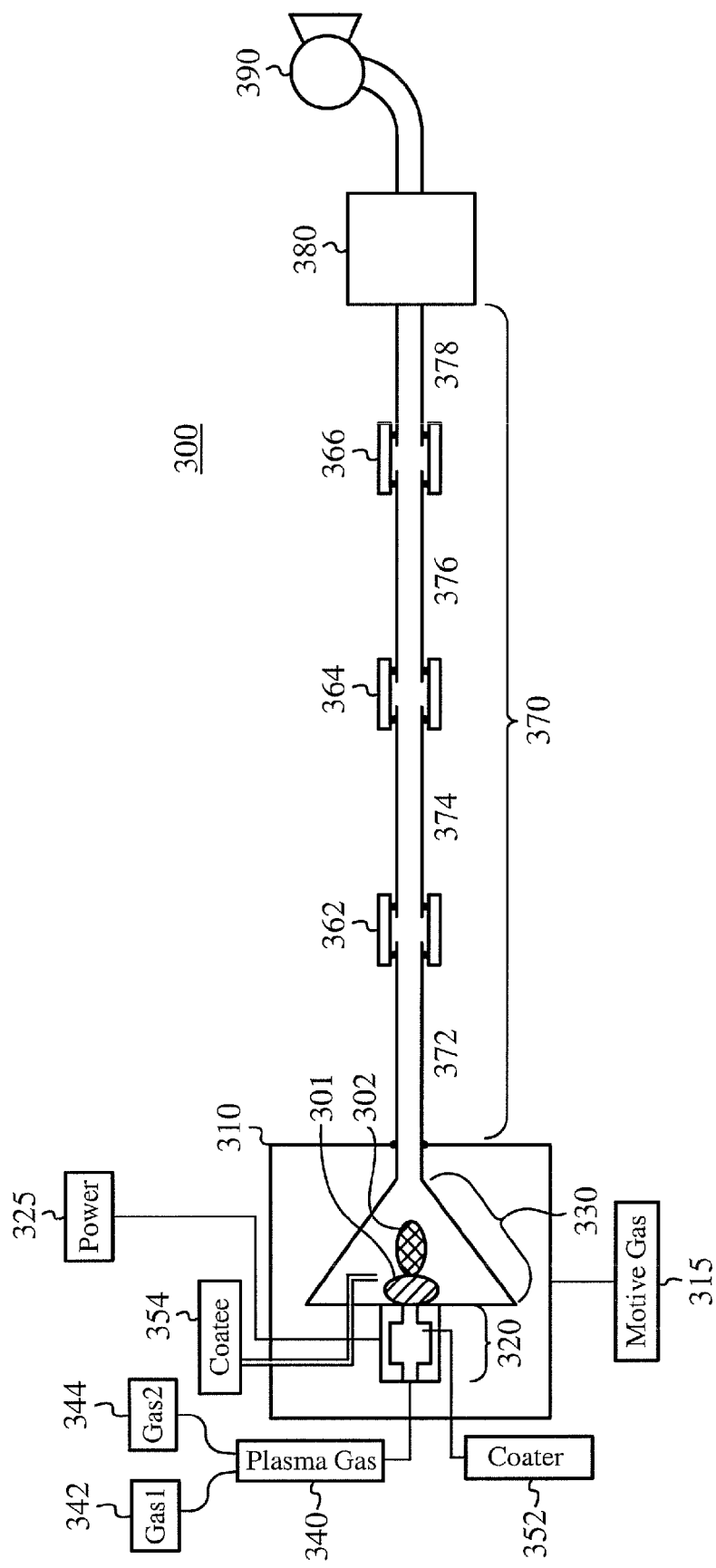
FIG. 3 illustrates one embodiment of a particle production system that synthesizes coated powders in accordance with the principles of the present invention.

FIG. 3 illustrates one embodiment of a particle production system 300 that synthesizes coated powders in accordance with the principles of the present invention. System 300 is disclosed in U.S. patent application Ser. No. 12/152,111, filed on May 9, 2008 and entitled, "POWDER COATING SYSTEM AND METHOD INCLUDING GUN EXTENSION", the entirety of which is hereby incorporated by reference as if set forth herein. The system 300 comprises a plasma production chamber 320, a coating chamber 330, a cooling conduit 370, a sampling system 380, and a motive pump 390. The plasma production chamber 320 and coating chamber 330 are preferably enclosed in a motive gas supply chamber 310. The motive gas supply chamber 310 is fluidly coupled to a motive gas supply system 315, which is configured to supply a motive gas. Preferably, the motive gas is an inert gas, such as argon. Furthermore, the chamber 310 preferably include airtight inlets and outlets configured to permit conduits to pass through to supply the plasma production chamber 320 and coating chamber 330. The motive gas supply chamber 310 can include airtight couplings that permit these conduits to pass through while preventing leakage either into or out of the chambers.

Furthermore, output from the coating chamber 330 can flow into the cooling conduit 370, which can also pass through a wall of the motive gas supply chamber 310. Preferably, the cooling conduit 370 also exits the motive gas supply chamber through an airtight coupling.

The plasma production chamber 320 preferably includes several types of inputs for receiving power, gas, and target materials. Inputs are provided to the chamber 320 by a variety of supply systems through means described below. Functional aspects of these supply systems are also described below.

Various input conduits fluidly couple the plasma gas supply mixer 340 with a first gas supply vessel 342 and a second gas supply vessel 344. The plasma gas supply system 340 includes an outlet fluidly coupled with an inlet of the plasma production chamber 320. The gas supply system 340 and the production chamber 320 are coupled by a conduit that passes through the motive gas supply chamber 310. Preferably, but not shown in the figure, an overall system controller provides control signals to the plasma gas supply system 340.

The power supply system 325 is also coupled to the plasma production chamber 320 through conduits that pass through the motive gas supply chamber 310. Preferably, but not shown in the figure, an overall system controller provides control signals to the power supply system 325.

The coater supply system 352 houses precursor material (e.g., metallic powder) and includes an externally controllable delivery system fluidly coupled to a materials inlet of the plasma production chamber 320. The supply system 352 is coupled with the production chamber 320 by a conduit that passes through the motive gas supply chamber 310. Preferably, but not shown in the figure, an overall system controller provides control signals to the supply system 352.

Preferably, the conduits that run between the plasma gas supply system 340 and the production chamber 320, the coater supply system 352 and the plasma production chamber 320, and the power supply system 325 and the plasma production chamber 320, all enter the motive gas supply chamber 310 through air-tight seals. In some embodiments, the conduits of the various supply systems all have dedicated airtight entrances to the motive gas supply chamber 310. In some embodiments, a single airtight entrance accommodates multiple conduits.

The coating chamber 330 preferably includes inlets for motive gas, coater material-plasma mixture, and coatee material, as well as an outlet to provide an output to the cooling conduit 370. The inlets for motive gas couple the motive gas supply chamber 310 to the interior of the coating chamber 330. Preferably, these inlets are channels of adjustable size that directly coupled the two chambers, yet permit for controlled flow from the supply chamber 310 into the coating chamber 330.

Coatee material (e.g., ceramic powder) is stored within the coatee material supply system 354, which preferably sits outside the motive gas supply chamber 310. A conduit passes from the supply system 354 through the motive gas supply chamber 310 and also through a wall of the coating chamber 330. The coatee material supply system 354 includes a controllable delivery system that provides coatee material to the conduit. Preferably, the conduit enters both chambers though airtight seals. The conduit terminates within the coating chamber at a selected location. Preferably, the location of the terminus is selected based on parameters of operation. Also preferably, but not shown, an overall system controller is configured to supply control signals to the supply system 354.

The cooling conduit 370 connects the coating chamber 330 with the sampling system 380. The conduit 370 exits the motive gas supply chamber 310 through airtight means. The cooling conduit 370 includes a first section 372, a second section 374, third section 376, and fourth section 378. The sections are joined by gas input couplings that contain gas input features. The first section 372 is joined to the second section 374 by the gas input coupling 362. In turn, the second section 374 is joined to the third section 376 by the gas input coupling 364. The gas input coupling 366 joins the third section 376 to the fourth section 378.

In the illustrated embodiment, no gas is shown being supplied to the gas input couplings 362, 364, 366 for input into the cooling conduit 370. However, gas can be supplied through one or more of the gas input couplings.

The sampling system 380 is fluidly coupled between the cooling conduit 370 and the motive pump 390. The sampling system 380 is configured to receive output from the cooling conduit 370, sample material having appropriate characteristics from the output, and permit remains of the output to flow to the motive pump 390, which is fluidly coupled through a conduit to the sampling system 380.

During operation, the supply systems 340, 352, and 325 provide plasma gas, coater material, and power, respectively, to the plasma production chamber 320. Power from the delivery system 325 is used to energize gas from the supply system 340 to produce a plasma within the production chamber 320.

The coater material supply system 352 provides coater material (e.g., metallic powder) in metered amounts into the plasma production chamber 320, exposing the coater material to plasma formed therein.

The overall control system (not shown) sends signals to the plasma gas supply system 340, coater material supply system 352, and power supply system 325 to set operational parameters. The plasma gas supply system 340 determines the ratio of mixing for the first and second gasses to produce plasma gas, as well as the rate at which the plasma gas feeds into the plasma production chamber 320. In a preferred embodiment, the first gas is hydrogen and the second gas is an inert gas, such as argon. The coater material supply system 352 determines the rate at which the coater material is supplied into the plasma production chamber 320. The power supply system 325 determines the voltage and amperage at which power is supplied to the plasma production chamber. In combination, these parameters determine the characteristics of the plasma produced within the plasma production chamber 320, as well as the characteristics of the plasma-coatee material mixture also produced within the chamber 320. Furthermore, although the coater supply system is described as providing only a single coater material into the plasma production chamber 320 at a single location, in some embodiments of the present invention, the coater supply system 352 supplies a plurality of materials into the plasma production chamber 320 at one or more locations. The motive gas supply chamber 310 receives motive gas, typically an inert gas such as argon, from a preferably dedicated motive gas supply system 315. The motive gas supply chamber 310 provides an airtight enclosure around the plasma production chamber 320 and coating chamber 330. The motive gas supply system 315 preferably maintains a pressure within the motive gas supply chamber 310 that slightly exceeds the ambient pressure of the environment in which the system 300 is housed, regardless of any variation in suction force generated by the motive pump 390.

The coating chamber 330 receives a coater material and plasma mixture from the plasma production chamber 320. The coating chamber 330 also receives motive gas through input features. Preferably, these input features provide for an adjustable flow rate of motive gas into the coating chamber 330. Motive gas flow is preferably motivated by the motive pump 390 by pulling a negative pressure on the conduit 370, motivating mass flow through the outlet of the coating chamber 370. However, the flow rate of the motive gas into the coating chamber 330 is preferably controlled by the overall control system.

Furthermore, the coatee material supply system 354 provides a metered stream of coater material through the coatee material conduit to the conduit's terminus location within the coating chamber 330. The rate at which coatee material is provided into the chamber 330 preferably is determined by the overall control system. Furthermore, although the terminus of the coatee material supply conduit is shown to deposit material only at one location within the coating chamber 330, in some embodiments of the present invention, the terminus deposits coatee material at a plurality of locations within the conduit (e.g., in an annular configuration surrounding output of the plasma production chamber 320).

Preferably, coating chamber 330 is shaped and the operational parameters of the apparatus 300 are controlled so that the coater material and plasma mixture enters the coating chamber and reaches a maximum enthalpy shortly thereafter. Most preferably, this maximum of enthalpy occurs within a defined region of the coating chamber 330, with the average enthalpy of the mixture falling as it moves away from that region with its minimum (within the coating chamber 330) coming at the outlet to the cooling conduit 370. For example, as illustrated in FIG. 3, the maximum enthalpy occurs in region 301. In these embodiments, the location of the terminus for delivery of the coatee material is chosen to be outside the maximum region and between the maximum region and the outlet.

Furthermore, in certain embodiments of the present invention, the coating chamber 330 is shaped and the operational parameters of the apparatus 300 are chosen so that the coater material begins to condense from the coater material and gas mixture within a defined region of the coating chamber 330. For example, in FIG. 3, the region 302 is such an initial condensation region. Typically, the initial condensation region lies between the maximum enthalpy region and the outlet of the coating chamber 330. In some embodiments, the coatee material is delivered into the initial condensation region. Preferably in these embodiments, sufficient enthalpy remains in the condensing mixture to vaporize the coatee material. Thus, as the coater material is condensing to form particles, the coatee material is vaporized mixed with the condensing particles. As the coater material gas particle mixture mixes with the vaporized coatee material and moves towards the outlet, the coater condenses on the coatee particles, forming a plurality of coated particles.

The cooling conduit 370 receives the coated particle and gas mixture from the coating chamber 330. Preferably, the mixture is pulled into the cooling conduit by the motive pump 390. However, in some embodiments, a motive pump or other system within the sampling system 380 provides some motive force to pull the mixture. Of course, to some extent, pressure provided by the plasma production chamber 320 and the motive gas supply 315 motivate the movement of the mixture into the cooling conduit 370.

In some embodiments, the cooling conduit 370 is equipped with an active cooling system. In some embodiments, a gas is supplied into the gas input couplings 362, 364, or 366. In some of these embodiments, the gas is a cooling and entraining gas. In some of these embodiments, the gas is a passivating gas configured to reduce the reactivity of the condensed particles within the mixture.

As mentioned above, the sampling system 380 preferably permits the motive pump 390 to provide a motive force therethrough. However, in some embodiments the sampling system 380 provides additional motive force. In some embodiments the sampling system 380 supplants the motive force provided by the motive pump 390 and provides a substitute motive force to the cooling conduit 370.

It is contemplated that the sampling system 380 can be configured in a variety of ways. In one embodiment, the sampling system 380 comprises a sampling structure, at least one filled aperture formed in the sampling structure, and at least one unfilled aperture formed in the sampling structure. Each filled aperture is configured to collect particles from the mixture stream, such as by using a filter. The sampling structure is configured to be adjusted between a pass-through configuration and a collection configuration. The pass-through configuration comprises an unfilled aperture being fluidly aligned with a conduit, such as conduit 140, thereby allowing the unfilled aperture to receive the mixture stream from the conduit and the mixture stream to flow through the sampling structure without substantially altering the particle content of the mixture stream. The collection configuration comprises a filled aperture being fluidly aligned with the conduit, thereby allowing the filled aperture to receive the mixture stream and collect particles while the mixture stream is being flown through the filled aperture. It is contemplated that the sampling structure can be adjusted between the pass-through configuration and the collection configuration in a variety of ways. In one embodiment, the sampling structure is a disk-shaped structure including an annular array of apertures, wherein the annular array comprises a plurality of the filled apertures and a plurality of the unfilled apertures. The sampling structure is rotatably mounted to a base, wherein rotational movement of the sampling structure results in the adjustment of the sampling structure between the pass-through configuration and the collection configuration. In another embodiment, the sampling structure is a rectangular-shaped structure including a linear array of apertures, wherein the linear array comprises a plurality of the filled apertures and a plurality of the unfilled apertures. The sampling structure is slideably mounted to a base, wherein sliding of the sampling structure results in the adjustment of the sampling structure between the pass-through configuration and the collection configuration.

Figure 4:
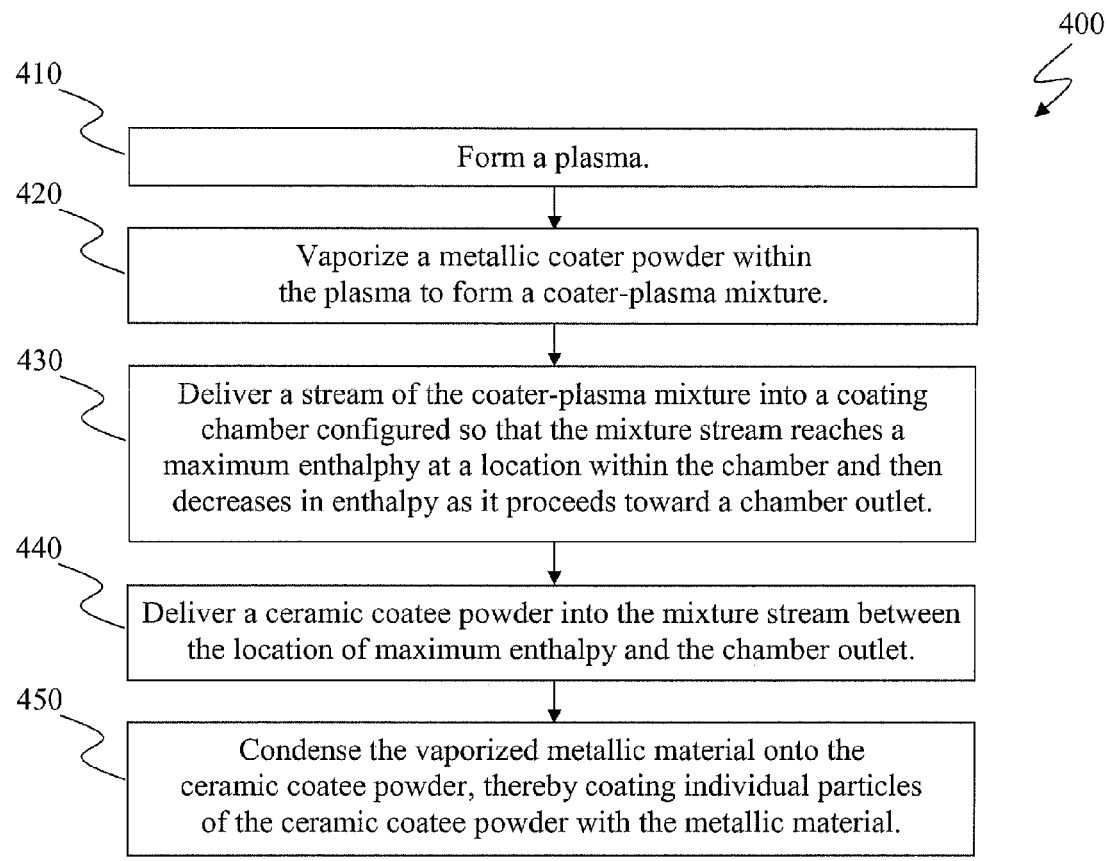
FIG. 4 is a flowchart illustrating one embodiment of a method of providing a plurality of particles having a ceramic core and a metallic outer layer in accordance with the principles of the present invention.

FIG. 4 is a flowchart illustrating one embodiment of a method of providing a plurality of particles having a ceramic core and a metallic outer layer in accordance with the principles of the present invention.

At step 410, a plasma is formed. It is contemplated that the plasma can be formed in a variety of ways. However, in a preferred embodiment, a working gas is supplied to a plasma production chamber, where the working gas is energized to form the plasma. Preferably, a plasma is formed from hydrogen and an inert gas, such as argon. Hydrogen is used to provide high heat conductivity within the plasma. By having a highly heat conductive plasma, higher vapor point coater materials can be used.

At step 420, a metallic coater powder (e.g., copper, tantalum, titanium, molybdenum, aluminum, etc.) is vaporized within the plasma to form a coater-plasma mixture. Preferably, as the gas used to form a plasma flows through a plasma production chamber in an 'upstream' area of the plasma production chamber, energy is delivered to the gas stream to form the plasma, then later in a 'downstream' area of the plasma production chamber, a coatee material is introduced into the resulting stream of plasma. However, it is contemplated that other configuration can be used as well. The material is vaporized and results in a stream of coater-plasma mixture.

At step 430, a stream of the coater-plasma mixture is delivered into a coating chamber. Preferably, the coating chamber is configured so that the mixture stream reaches a maximum enthalpy at a location within the chamber and then decreases in enthalpy as it proceeds toward a chamber outlet.

At step 440, a ceramic coatee powder (e.g., boron carbide) is delivered into the mixture stream between the location of maximum enthalpy and the chamber outlet. It is possible for such delivery to take place at a location where the stream has sufficient enthalpy to vaporize the coatee material. Furthermore, the method optionally includes additional steps, such as maintaining the mixture at a selected enthalpy below the maximum enthalpy to vaporize the ceramic coatee material.

At step 450, the vaporized metallic material is partially or completely condensed onto the ceramic coatee powder, thereby coating the individual ceramic particles with the metallic material and forming a plurality of particles, each having a ceramic core with a metallic outer layer.

Referring back to the method in FIG. 1, at step 120, a tile is formed from the plurality of particles. It is noted that these particular particles, each having a ceramic core surrounded by a metallic outer layer, help form a novel tile that provides significant advantages over the prior art. The ceramic core maintains the toughness of the resulting tile, while the metallic outer layer makes the tile more ductile, thereby reducing the likelihood of fracture.

It is contemplated that this formation can be achieved in a variety of ways. In some embodiments, the tile is formed by performing a sintering process on the plurality of particles. When using nano-particles to form the tile, maintaining the nano-scale properties of the particles during formation may be difficult. For example, performing a standard sintering process on a plurality of nano-particles will typically result in an undesirable amount of melting of the nano-particles due to the high-temperature of the standard sintering process, thereby leading to nano-particles uniting with nearby nano-particles to a degree that they form particles that are larger than nano-particles. Therefore, in order to maintain the nano-scale properties of the particles within the formed tile, some embodiments employ spark plasma sintering (also known as field assisted sintering technique) on the plurality of particles to form the tile. Spark plasma sintering uses axial pressure and elevated temperature that are generated by a current flow. The energy released by the current raises the temperature in the graphite dies enclosing the powder and within powders that have some electrical conductivity. The heat is generated internally, in contrast to conventional hot pressing, where the heat is provided by external heating elements. The spark plasma sintering process is very fast, thereby ensuring it has the potential of densifying powders with nanosize or nano-structure, while avoiding coarsening which accompanies standard densification routes. Spark plasma sintering provides significant advantages by lowering the required sintering temperature and shortening its duration. It is contemplated that the spark plasma sintering can also be advantageously used when forming a tile from particles other than nano-particles, such as micron-sized particles.

At step 130, the tile is bonded to a ductile backing material using heat-curable adhering material and catalyzed foamable exothermic material between the tile and the ductile backing material. Such a bonding process is described in U.S. Pat. No. 6,117,376 to Merkel, entitled "Method of Making Foam-Filled Composite Products," the entirety of which is hereby incorporated by reference as if set forth herein. Merkel discloses a method for making foam-filled parts having fiber-reinforced skins or surfaces. Mold halves of pressure-resisting thermally insulative material are covered with a release material, which is then covered with the fiber skins. The fiber skins are coated with heat-curable resin, and the mold halves are then clamped together to form a cavity. A catalyzed foam-forming mixture is poured into the cavity. The mixture foams and expands to the full volume of the cavity. While the mixture hardens, it generates heat sufficient to cure the resin.

In some embodiments, the concave inner surfaces of the mold halves are covered with a commercial Teflon™ sheet having an adhesive backing. This material adheres to the mold face through numerous replications of parts and freely releases from polymers that are cured in direct contact with its surface. This approach also has the advantage of avoiding contamination of the resin surface with the release agent, such as wax-based materials. Dry (i.e., unimpregnated) fiber-reinforced skin material is laid in to cover the inner surfaces of the mold halves. The fiber skins can be in loosely woven sheet or strip form, having sufficient cross weave fibers to permit easy handling without separating. The fibers are then thoroughly wetted or impregnated in place with an uncured resin, such as an epoxy resin from West, sold as system resin with 205 or 206 hardener. The hardener is a thermally activated catalyst that requires a long term curing at ambient temperature, although it acts quickly above a threshold, so that it remains wet until the proper time in the ensuing process. The resin system causes the fiber reinforcement to adhere tightly to the inner surfaces of the mold halves, despite the Teflon™ covering. With the two mold halves prepared in this manner, they can be placed together. With side flanges being in intimate contact, an interior cavity is defined between the concave inner surfaces of the mold halves, and C-clamps are then placed about the periphery of the flanges and tightened. The clamped mold halves thus form what may be regarded as a pressure vessel. In addition, a malleable seal is placed across one end of the mold cavity.

When the two mold halves are clamped together in opposition, the C-clamps are tightened sufficiently on the flanges to prevent leakage of foam material out the sides. The mold cavity is thus sealed on three sides, and can be placed in a substantially vertical position so that a premixed foamable liquid can be poured in immediately after preparation. This mix may be of the type such as Polytech 20/08-, and will include the proper amount of catalyst for the volume of resin and the cavity. This material expands to about 40 times its original volume. The foamable liquid mix rapidly begins to expand and build up interior pressure within the mold cavity after being poured. The reaction is strongly exothermic, and heats the foam to in excess of 300 degrees F. as it expands under significant local pressure everywhere in the mold cavity. The heat is conducted into the skin layers throughout. A property of this mixture, however, is that the expansion is self-limiting, in that while significant pressure is generated during expansion, total expansion is limited by the rapid hardening characteristic of the material. Consequently, while the predetermined volume of mix is such that material foams out of the top of the mold cavity, and may even leak through the malleable seal to a limited extent, the interior of the mold cavity is uniformly pressurized and there are no voids. The heat generated by the exotherm raises the temperature of the wet resin matrix at the skin above the curing level. A high temperature level is also maintained for many more minutes by the insulative characteristic of the mold halves. The close physical, pressurized contact between the foam and the skin resin system not only cures the skins into true fiber-reinforced composites, but assures chemical adherence at the interface between the foam and the skin on all surfaces. Typically, after one to two hours, the C-clamps are released and the mold halves are readily separated from the formed composite.

While any of the features of U.S. Pat. No. 6,117,376 to Merkel can be used in the bonding process of the present invention, it is contemplated that certain modifications can be made in order to bond an inorganic tile to a ductile backing material, which is not disclosed in Merkel. For example, in some embodiments, fiber skins may be required on only one of the mold halves or on one side of the composite (e.g., acting as the ductile backing material). Additionally, in some embodiments, the resin (or other heat curable adhering material) may be required on only one of the mold halves or on one side of the composite. Furthermore, in some embodiments, separable mold halves may not be required. In some embodiments, all that is required is that an interior volume between the tile and the ductile backing material be sealed to a degree sufficient to allow the catalyzed foamable exothermic material to expand and build up interior pressure within the interior volume, thereby creating physical pressurized contact between the catalyzed foamable exothermic material and the heat-curable adhering material of each of the tile and the ductile backing material. Other modifications are within the scope of the present invention as well.

Figures 5A, 5B:
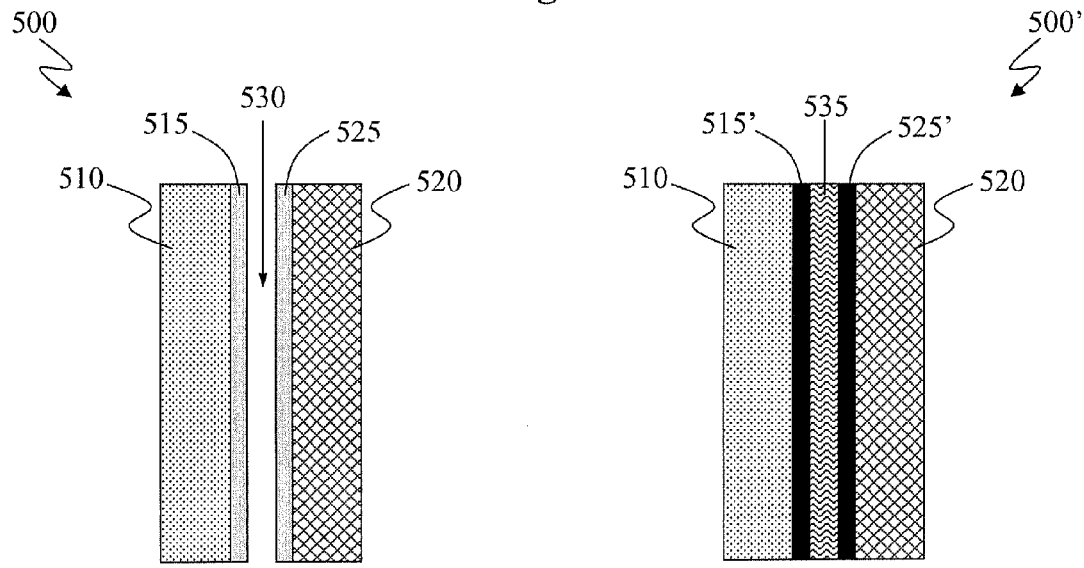
FIG. 5A illustrates one embodiment of a tile and a ductile backing material before insertion of catalyzed foamable exothermic material within the interior volume between them.
FIG. 5B illustrates one embodiment of a tile and a ductile backing material after insertion of catalyzed foamable exothermic material within the interior volume between them in accordance with the principles of the present invention.

FIG. 5A illustrates one embodiment 500 of a tile 510 and a ductile backing material 520 before insertion of catalyzed foamable exothermic material within the interior volume 530 between them. The tile 510 is formed from the plurality of particles previously discussed. In some embodiments, the ductile backing material 520 is formed from organic material. In some embodiments, the ductile backing material 520 is formed from a plurality of fibers. In some embodiments, the ductile backing material 520 is formed from a plurality of polyethylene fibers. In some embodiments, the ductile backing material 520 is Dyneema® or Kevlar®.

The interior surface of the tile 510 is wetted with a heat-curable adhering material 515. The interior surface of the ductile backing material 520 is also wetted with a heat-curable adhering material 525. In some embodiments, heat-curable adhering material 515 and heat-curable adhering material 525 are the same material. In some embodiments, the adhering material is resin.

An interior volume 530 is formed between the tile 510 and the ductile backing material 520, with the interior surface of the tile 510 and the interior surface of the ductile backing material 520 facing one another. The interior surface of the tile 510 and the interior surface of the ductile backing material 520 each form a boundary of the interior volume 530. The tile 510 and the ductile backing material 520 can be secured in this position using mold halves and/or clamps, and/or other securing and sealing means. For the purposes of this disclosure, the interior volume 530 does not extend into any area that is not disposed between the tile 510 and the ductile backing material 520.

A catalyzed foamable exothermic material, such as that used in U.S. Pat. No. 6,117,376 to Merkel, is inserted into the interior volume after wetting the interior surfaces of the tile 510 and the ductile backing material 520 with the heat-curable adhering material. An amount of catalyzed foamable exothermic material is used that is sufficient to fill (in some cases, overfill) the entire interior volume when foamed and form a solid foam body between the tile 510 and the ductile backing material 520. The exotherm from the foaming is allowed to activate and cure the heat-curable adhering material 515, 525 for a time sufficient to unite the solid foam body to the heat-curable adhering material 515, 525 of the tile 510 and the ductile backing material 520.

FIG. 5B illustrates one embodiment 500' of the tile 510 and the ductile backing material 520 after insertion of catalyzed foamable exothermic material within the interior volume between them in accordance with the principles of the present invention. The catalyzed foamable exothermic material has expanded to form a solid foam body 535 that fills the entire interior volume 530. The heat-curable adhering material 515 and 525 has been cured by the exotherm from the foaming to form cured adhering material 515' and 525'.

The use of the catalyzed foamable exothermic material and heat-curable adhering material provides a significant advantage over the use of an autoclave, which is the standard way of bonding a meltable plate to a hard plate. An autoclave process is too hot, resulting in the loss of certain advantageous properties (e.g., nano-scale properties) of the tile 510. Typically, the maximum temperature of the bonding process is half the melting point temperature of the particles of the tile 510. However, when the tile 510 is formed from nano-particles, the maximum temperature of the bonding process is preferably one-quarter of the melting point temperature of the particles of the tile 510. Using the exotherm from the foamable material instead of the heat from an autoclave allows the temperature of the bonding process to be sufficiently minimized and the tile 510 to retain its advantageous structural properties.

It is noted that while FIGS. 5A-B show certain shapes and sizes of the components, other shapes and sizes, as well as other configurations, are also within the scope of the present invention. For example, the tile 510, ductile backing material 520, and the interior volume 530 are shown as having substantially rectangular features. However, it is contemplated that these components can be shaped in other ways, such as with curves. Additionally, although the tile 510 and the ductile backing material 520 are shown having substantially the same thickness, it is contemplated that one can be substantially thicker than the other. Furthermore, the heat-curable adhering material 525 may extend into the ductile backing material 520. For example, in an embodiment where the ductile backing material 520 comprises fibers, the fibers may be held together and/or in position by the heat-curable adhering material.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A tile comprising a plurality of plasma-created nano-particles bonded together, wherein each one of the nano-particles comprises a ceramic core comprising boron carbide and a metallic outer layer directly deposited onto the core, wherein the nano-particles comprise an average grain size of less than 250 nanometers and are bonded together so that the nano-particle size and structure is maintained in the tile.

2. The tile of claim 1, wherein the metallic outer layer comprises at least one of copper, tantalum, titanium, molybdenum, and aluminum.

3. A composite material comprising:
a tile comprising a plurality of plasma-created nano-particles bonded together, wherein each one of the particles comprises a ceramic core comprising boron carbide and a metallic outer layer directly deposited onto the core wherein the nano-particles comprise an average grain size of less than 250 nanometers; and
a ductile backing material bonded to the tile.

4. The composite material of claim 3, wherein the metallic outer layer comprises at least one of copper, tantalum, titanium, molybdenum, and aluminum.

5. The composite material of claim 3, wherein the ductile backing material comprises a plurality of fibers.

6. The composite material of claim 3, wherein the ductile backing material comprises a plurality of polyethylene fibers.

7. The composite material of claim 3, further comprising an adhering material disposed between the tile and the ductile backing material, wherein the adhering material bonds the tile and the ductile backing material together.

8. The composite material of claim 3, further comprising a cured adhering material and a foam material disposed between the tile and the ductile backing material, wherein the cured adhering material and the foam material bond the tile and the ductile backing material together.

9. A composite material comprising:
a tile comprising a plurality of plasma-created nano-particles bonded together, wherein each of the nano-particles comprises a ceramic core comprising boron carbide and a metallic outer layer that is directly deposited onto the ceramic core, wherein the nano-particles comprise an average grain size of less than 250 nanometers and are bonded together so that the nano-particle size and structure is maintained in the tile.

10. The composite material of claim 9, wherein the metallic outer layer is formed by condensing a plasma vaporized metallic material on the ceramic core.

11. The composite material of claim 9, wherein the metallic outer layer comprises at least one of copper, tantalum, titanium, molybdenum, and aluminum.

* * * * *